(12) United States Patent
Han

(10) Patent No.: US 7,122,387 B2
(45) Date of Patent: Oct. 17, 2006

(54) DEPOSITION STOP TIME DETECTION APPARATUS AND METHODS FOR FABRICATING COPPER WIRING USING THE SAME

(75) Inventor: Jae-Won Han, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 23 days.

(21) Appl. No.: 10/869,263

(22) Filed: Jun. 16, 2004

(65) Prior Publication Data

US 2004/0259354 A1 Dec. 23, 2004

(30) Foreign Application Priority Data

Jun. 19, 2003 (KR) .................... 10-2003-0039907

(51) Int. Cl.
*H01L 21/66* (2006.01)

(52) U.S. Cl. .................... 438/17; 438/18; 257/E21.52; 257/E21.53

(58) Field of Classification Search ................ 438/687, 438/17, 18; 257/E21.522, E21.529, E21.531
See application file for complete search history.

(56) References Cited

U.S. PATENT DOCUMENTS

| 5,290,396 | A | * | 3/1994 | Schoenborn et al. | ........ 438/427 |
| 5,400,209 | A | * | 3/1995 | Moslehi | ...................... 361/234 |
| 5,960,254 | A | * | 9/1999 | Cronin | .......................... 438/14 |
| 6,022,465 | A | | 2/2000 | Ting et al. | ................... 205/118 |
| 6,277,263 | B1 | | 8/2001 | Chen | ........................... 205/182 |
| 6,391,166 | B1 | | 5/2002 | Wang | .......................... 204/224 |
| 2003/0000840 | A1 | * | 1/2003 | Kimura et al. | ................. 205/81 |

* cited by examiner

*Primary Examiner*—Caridad Everhart
(74) *Attorney, Agent, or Firm*—Andrew D. Fortney

(57) ABSTRACT

A method for fabricating copper wiring of a semiconductor device comprises forming a deposition stop time detection pattern having two trench structures positioned with a predetermined distance from each other on a dielectric substrate; positioning a deposition stop time detection apparatus having a plurality of detection electrodes and a guide device above the deposition stop time detection pattern; depositing copper on the substrate; and stopping deposition of the copper by an electric signal being generated when the two detection electrodes are electrically connected by the copper deposited in the two trench structure.

10 Claims, 2 Drawing Sheets

DEPOSITION STOP TIME DETECTION APPARATUS AND METHODS FOR FABRICATING COPPER WIRING USING THE SAME

TECHNICAL FIELD

The present disclosure relates to semiconductor fabrication and, more particularly, to deposition stop time detection apparatus and methods for fabricating copper wiring using the same.

DESCRIPTION OF THE RELATED ART

Typically, the copper wiring method for fabricating semiconductor devices is performed by first forming a hole on a dielectric substrate and then depositing barrier metal thereon. A seed layer is deposited and the copper is deposited by means of an electroplating technique. That is, after depositing the copper with sufficient thickness, the copper layer is polished through a chemical-mechanical polishing (CMP) process. Such apparatuses and methods for patterning the copper wire, using the electroplating technique, are disclosed in the U.S. Pat. No. 6,391,166; U.S. Pat. No. 6,277,263; and U.S. Pat. No. 6,022,465.

In these cases, because the copper is thickly deposited and then is polished in considerable amount, these cases result in increased manufacturing costs. Additionally, the long process time for the CMP process limits the number of the wafers that can be processed per unit of time. Avoiding this problem requires additional equipment. Additionally, the contaminants generated during the CMP process can cause malfunctioning of the semiconductor device.

DETAILED DESCRIPTION

Figure 1:
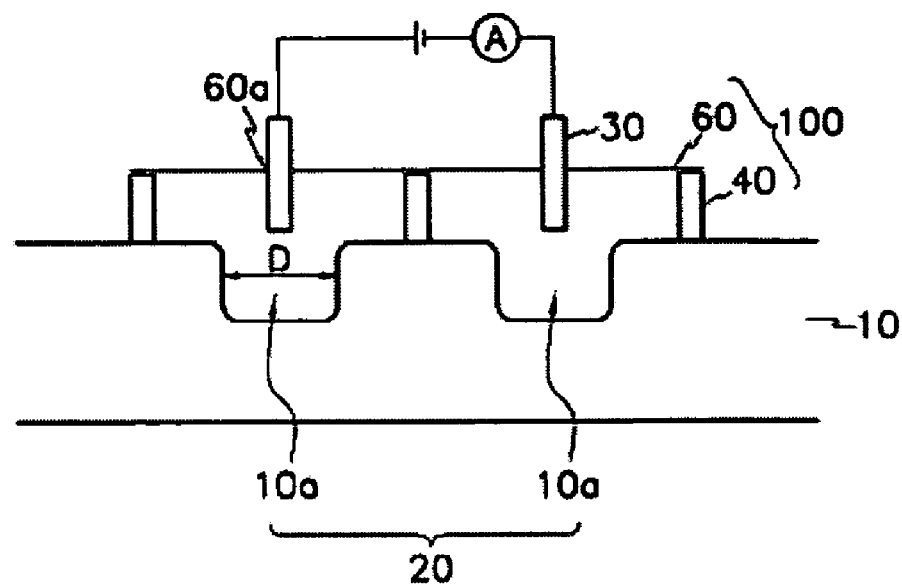
FIG. 1 is a side elevation view illustrating an example deposition stop time detection apparatus positioned on a deposition stop time detection pattern according to a disclosed method for fabricating copper wiring of a semiconductor device.

As illustrated in FIG. 1, an example deposition stop time detection apparatus comprises a plurality of detection electrodes 30 electrically connected with each other and a guide device 100 for guiding the detection electrodes 30 in a vertical direction.

The guide device 100 includes a plurality of guide pins 40 and a guide plate 60 that connects the guide pins 40 with each other and is provided with a guide hole 60a at its center through which the detection electrodes 30 pass. The guide device 100 may be made of dielectric material.

Figure 2:
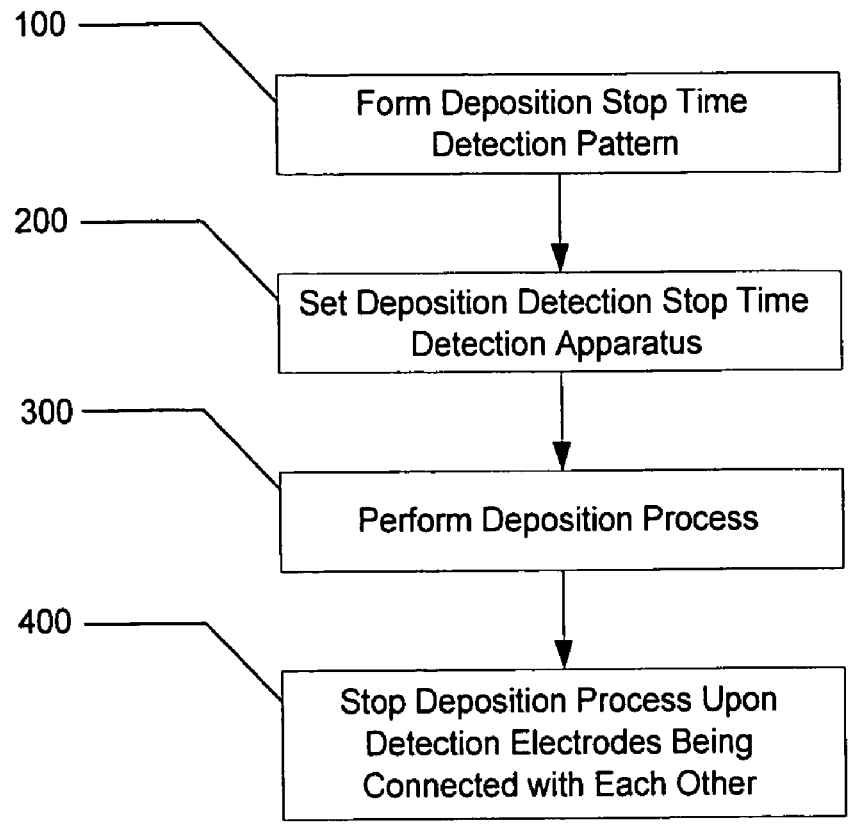
FIG. 2 is a flowchart illustrating an example method for fabricating the copper wiring of a semiconductor.

FIG. 2 is a flowchart illustrating an example method for fabricating the copper wiring of a semiconductor device. As shown in FIG. 1 and FIG. 2, first, a pair of deposition stop detection patterns 20 are formed at two trench structures 10a and 10b that are positioned with a predetermined distance on the dielectric substrate 10. The deposition stop time detection pattern 20 has a structure in that a plurality of grooves, i.e., trenches 10a, are arranged with predetermined distances. In one arrangement, the two trenches 10a are formed for one deposition stop time detection pattern 20, but more than two trenches may be used.

The width D of the trench 10a of the deposition stop time detection pattern 20 is formed so as to be broader than that of the widest pattern of the semiconductor device. The deposition stop time detection pattern 20 is formed on a scribe line. The deposition stop time detection pattern 20 can be formed on the dielectric substrate 10 during the device fabrication process (100).

The deposition stop time detection device is positioned on between the plurality of trenches 10a on the dielectric substrate 10 after the deposition stop time detection pattern 20 is formed. That is, the guide device 100 is positioned on the dielectric substrate 10. At this time, the guide pins 40 of the guide device 100 are positions between the trenches 10a on the dielectric substrate 10.

Subsequently, the detection electrode 30 is located inside of the guide hole 60a of the guide pins 40. In this case, the detection electrode 30 may be positioned over the deposition stop time detection pattern 20. That is, the detection electrode 30 may be positioned inside the trench 10a with a predetermined distance from the sidewalls of the trench 10a and a predetermined height above the horizontal surface of the dielectric substrate 10. The thickness of the detection electrode 30 is formed so as to be narrower than width of the trench 10a (200).

Next, the copper deposition process is carried out using an electroplating (EP) process. During the EP process, the copper is deposited on the dielectric substrate 10 and inside the trench 10a (300). When the copper is deposited on the two trench structures of the deposition stop time detection pattern 20 to a height that electrically connects the detection electrodes 30 with each other, an electric signal is generated, resulting in stopping of the copper deposition process.

Figure 3:
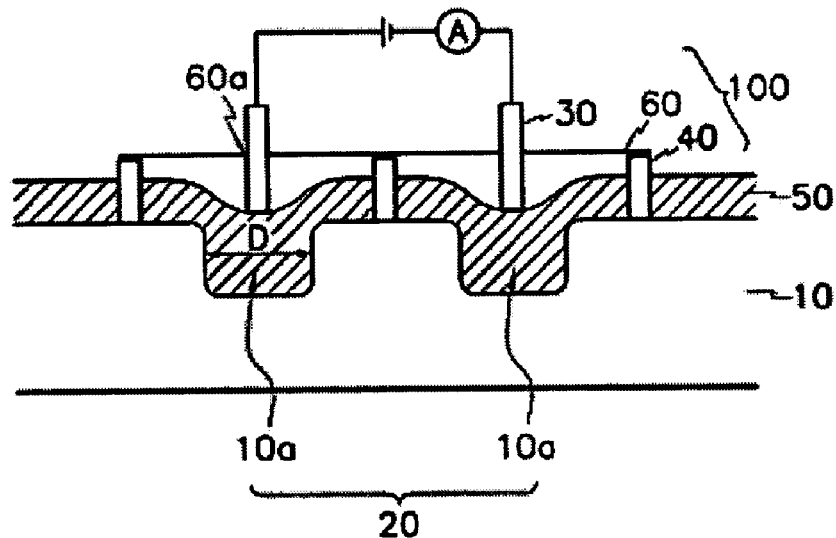
FIG. 3 is a sectional view illustrating an example deposition stop time during fabrication of the copper wiring of a semiconductor.

That is, as illustrated in FIG. 3, if the thin copper film 50 is filled in the trench 10a of the deposition stop time detection pattern 20, which is broader than the pattern of the semiconductor, the two detection electrodes 30 are electrically connected through the deposited thin copper film 50. Accordingly, an electrical feed back signal is transmitted to the copper plating apparatus to stop the copper deposition process (400).

The deposition stop time detection apparatus and the method for fabrication the copper wiring of the semiconductor using the deposition stop time detection apparatus as disclosed herein detects the time at which the deposition process should stop by positioning detection electrodes over the deposition stop time detection pattern, such that it is possible to prevent the copper from being deposited too thickly inside the trenches or vias.

As disclosed herein, a deposition stop time detection apparatus and a method for fabricating copper wiring is capable of preventing the copper from being thickly deposited in trenches of semiconductor devices. An example deposition stop time detection apparatus includes a plurality of detection electrodes electrically coupled with each other and a guide device for vertically guiding and positioning the detection electrodes. In such an arrangement, the guide device includes a plurality of guide pins and a guide plate for connecting the guide pins with each other. In one arrangement, the guide plate may include a guide hole at its center through which the detection electrodes pass. The guide device may be made of dielectric material.

The disclosed methods for fabricating the copper wiring of the semiconductor includes forming a deposition stop time detection pattern positioned with a predetermined distance to two trench structures on the dielectric substrate; positioning a deposition stop time detection apparatus having detection electrodes and a guide device on the deposition stop time pattern; performing a copper deposition process; stopping the copper deposition process when the detection electrodes being electrically connected with each other so as to generate an electric signal due to copper deposition in the trenches.

Also, the deposition stop time detection pattern may be formed on a scribe line. A width of the trench may be formed so as to be wider than that of a widest one among patterns of the semiconductor device being fabricated. The detection electrodes may also be positioned inside of the trenches with predetermined distances from side walls of the trenches. The thickness of each detection electrode may be thinner than that of the trench. The detection electrodes may be positioned with a predetermined height above a horizontal line or surface of the dielectric substrate.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for fabricating copper wiring of a semiconductor device comprising:
    forming a deposition stop time detection pattern having two trench structures positioned with a predetermined distance from each other on a dieletric substrate;
    positioning a deposition stop time detection apparatus having a plurality of detection electrodes and a guide device above the deposition stop time detection pattern, each detection electrode being positioned inside a corresponding trench a predetermined distance from a sidewall of the trench;
    depositing copper on the substrate; and
    stopping deposition of the copper by an electric signal being generated when two detection electrodes of the plurality of detection electrodes are electrically connected by the copper deposited in the two trench structure.

2. A method as defined by claim 1, wherein the deposition stop time detection pattern is formed on a scribe line.

3. A method as defined by claim 1, wherein a width of each trench is wider than that of widest pattern of the semiconductor.

4. A method as defined by claim 1, wherein a thickness of each detection electrode is narrower than a width of the trench.

5. A method as defined by claim 1, wherein a low end of the detection electrode is positioned above the dielectric substrate with a predetermined distance.

6. A method for fabricating copper wiring of a semiconductor device comprising:
    forming a deposition stop time detection pattern having two trench structures positioned with a predetermined distance from each other on a dielectric substrate;
    positioning a deposition stop time detection apparatus having a plurality of detection electrodes and a guide device above the deposition stop time detection pattern, each detection electrode having a thickness less than a width of the trench;
    depositing copper on the substrate; and
    stopping deposition of the copper by an electric signal being generated when two detection electrodes of the plurality of detection electrodes are electrically connected by the copper deposited in the two trench structure.

7. A method as defined by claim 6, wherein the deposition stop time detection pattern is formed on a scribe line.

8. A method as defined by claim 6, wherein a width of each trench is greater than that of a widest pattern of the semiconductor.

9. A method as defined by claim 6, wherein each detection electrode is positioned inside a corresponding trench with a predetermined distance from a sidewall of the trench.

10. A method as defined by claim 6, wherein a low end of the detection electrode is positioned a predetermined distance above the dielectric substrate.

* * * * *